United States Patent
Yin et al.

(10) Patent No.: US 8,836,105 B2
(45) Date of Patent: Sep. 16, 2014

(54) SEMICONDUCTOR DEVICE PACKAGE WITH CAP ELEMENT

(71) Applicants: Baoguan Yin, Tianjin (CN); Junhua Luo, Tianjin (CN); Deguo Sun, Tianjin (CN)

(72) Inventors: Baoguan Yin, Tianjin (CN); Junhua Luo, Tianjin (CN); Deguo Sun, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 157 days.

(21) Appl. No.: 13/681,437

(22) Filed: Nov. 20, 2012

(65) Prior Publication Data
US 2014/0027896 A1     Jan. 30, 2014

(30) Foreign Application Priority Data

Jul. 27, 2012  (CN) ...................... 2012 2 0524796 U

(51) Int. Cl.
| | |
|---|---|
| H01L 23/48 | (2006.01) |
| H01L 23/00 | (2006.01) |
| H01L 21/56 | (2006.01) |
| H01L 23/49 | (2006.01) |
| H01L 23/495 | (2006.01) |
| H01L 23/433 | (2006.01) |
| H01L 23/31 | (2006.01) |

(52) U.S. Cl.
CPC ................ *H01L 23/49* (2013.01); *H01L 24/97* (2013.01); *H01L 21/561* (2013.01); *H01L 23/49541* (2013.01); *H01L 21/56* (2013.01); *H01L 23/49537* (2013.01); *H01L 23/4334* (2013.01); *H01L 23/3107* (2013.01); *H01L 2224/97* (2013.01); *H01L 2224/48091* (2013.01)

USPC .......... 257/692; 257/678; 257/706; 257/708; 257/718; 257/E33.056; 257/E23.001; 257/E21.499

(58) Field of Classification Search
USPC .......... 257/692, 678, 706, 708, 718, E33.056, 257/E23.001, E21.499
See application file for complete search history.

(56) References Cited

U.S. PATENT DOCUMENTS

| | | | |
|---|---|---|---|
| 5,049,973 | A | 9/1991 | Satriano et al. |
| 5,886,396 | A | 3/1999 | Carney et al. |
| 6,097,602 | A | 8/2000 | Witchger |
| 6,393,130 | B1 | 5/2002 | Stonikas et al. |
| 6,734,552 | B2 | 5/2004 | Combs et al. |
| 7,012,324 | B2 | 3/2006 | Li et al. |
| 7,126,218 | B1 | 10/2006 | Darveaux et al. |
| 7,202,561 | B2 | 4/2007 | Seo |
| 7,482,679 | B2 | 1/2009 | Aripin et al. |
| 8,013,440 | B2 | 9/2011 | Warren |

*Primary Examiner* — Timor Karimy
(74) *Attorney, Agent, or Firm* — Charles Bergere

(57) ABSTRACT

A method of assembling a semiconductor device includes providing a substrate having an array of substrate elements linked by substrate corner elements and separated by slots extending between the corner elements. Semiconductor dies are positioned on the substrate elements. A cap, frame and contact structure is provided that has a corresponding array of caps supported by corner legs linking the caps to frame corner elements, frame elements linking the frame corner elements, and sets of electrical contact elements supported by the frame elements. The cap, frame and contact structure is fitted on the substrate with the caps extending over corresponding dies, the frame corner elements extending over the substrate corner elements, and the sets of electrical contact elements disposed in the slots. The dies are connected electrically with the electrical contact elements and the assembly is encapsulated and singulated. Singulating removes the frame elements.

10 Claims, 5 Drawing Sheets

SECTIONAL VIEW C-C

SECTIONAL VIEW C-C

SECTIONAL VIEW C-C

SEMICONDUCTOR DEVICE PACKAGE WITH CAP ELEMENT

BACKGROUND OF THE INVENTION

The present invention is directed to semiconductor devices and, more particularly, to packaged semiconductor devices having one or more semiconductor dies on a substrate with a cap.

Semiconductor device packaging fulfils basic functions such as providing electric connections and protecting the die against mechanical and environmental stresses. The completed semiconductor device may be mounted on a support with electrical connectors, such as a printed circuit board (PCB), for example. The semiconductor device has exposed external electrical contact surfaces or leads for connection to the electrical connectors on the support. Using surface mount technology, external electrical contact surfaces or leads of the package can be soldered directly to corresponding pads on the support, providing mechanical attachment as well as electrical connections.

Semiconductor devices are commonly packaged for surface mounting by encapsulating one or more semiconductor dies, the encapsulation process including embedding the die or dies in a molding compound. Various techniques are available for connecting the external electrical contact surfaces or leads of the package internally with electrical contact pads on the embedded semiconductor die. It is common to facilitate manufacturing operations by performing many of the operations on arrays of the components of the devices which are linked together, the links being severed during singulation of the devices.

In a metal base package, the substrate is an electrically and thermally conductive metal flag, which assists in dissipating heat. A metal flag structure may be provided, which has an array of the flags linked by frame members which are cut off and discarded during singulation. The flag structure may also include sets of electrical contact surfaces or leads which are supported by and integral with the frame members, until the devices are encapsulated and the frame members are cut off and discarded during singulation to isolate the electrical contact surfaces or leads from each other. This technique is limited to devices where the sets of electrical contacts are disposed at the periphery of the metal flag and the semiconductor die, on opposing sides or around all four sides.

In a laminate or ceramic base package, the substrate is an electrically insulating substrate bearing the external electrical contact surfaces. Examples of laminate base packages include ball grid array (BGA), pin grid array (PGA) and land grid array (LGA) packages. The electrically insulating materials used for such substrates are typically thermally insulating also, and hence do not assist in cooling the device.

A semiconductor device may have a cap that covers a face of the semiconductor die or dies. Such a cap may be formed of a thermally conductive material and function as a heat sink, distributing internally generated heat over the face of the semiconductor die or dies and dissipating the heat, by conduction radiation and/or convection, for example. Such a cap may be formed of an electrically conductive material and also function as an electromagnetic shield, typically in conjunction with an electrically conductive substrate beneath the semiconductor die or dies, in order to reduce electromagnetic interference effects.

Whether or not the substrate on which the die is mounted has similar properties to the cap, such a cap is particularly effective when the active face of the die is upwards and near to the cap. However, integrating the cap in the semiconductor device may involve extra process steps, increasing the cost of the device and introducing additional risks of manufacturing defects, which it is desirable to minimize or eliminate.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF THE INVENTION

Figure 14:
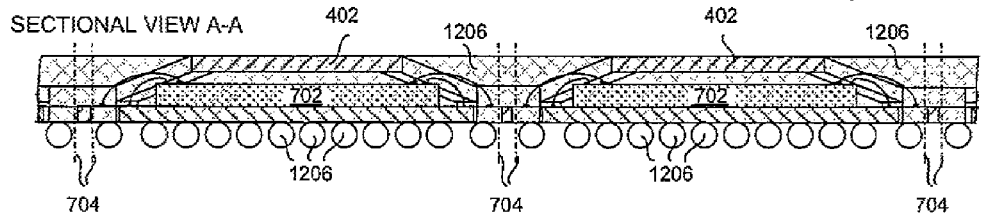
FIGS. 14 and 15 are schematic sectional views of the structure of FIG. 4 along the line A-A at later stages of a semiconductor device in accordance with this embodiment of the invention and produced by the method illustrated in FIGS. 1 to 14.
Figure 15:
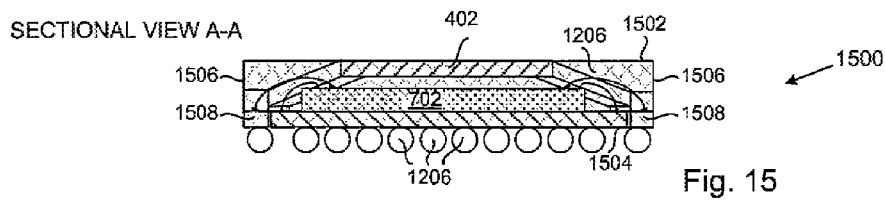

FIG. 15 illustrates a surface mount semiconductor device 1500 in accordance with an embodiment of the invention, given by way of example, and FIGS. 1 to 15 illustrate a method of making the semiconductor device 1500 in accordance with an embodiment of the invention, given by way of example.

The method illustrated in FIGS. 1 to 15 comprises providing a substrate structure 100 (FIGS. 1 to 3) having an array of substrate elements 102 linked by substrate corner elements 104 and separated by slots 106 extending between the substrate corner elements 104. An array of semiconductor dies 702 (FIG. 7) is positioned on the array of substrate elements 102. A cap, frame and contact structure 400 (FIGS. 4 to 6) is provided which has a corresponding array of caps 402 supported by corner legs 404 linking the caps 402 to frame corner elements 406, a plurality of frame elements 408 linking the frame corner elements 406, and sets of electrical contact elements such as 410 supported by the frame elements 408. An assembly 700 (FIGS. 7, 10 and 11) is formed by aligning the cap, frame and contact structure 400 on the substrate structure 100, with the caps 402 extending over corresponding semiconductor dies 702, the frame corner elements 406 extending over the substrate corner elements 104, and the sets of electrical contact elements 410 disposed in the slots 106. The semiconductor dies 702 are connected electrically with the electrical contact elements 410. The assembly 700 including the substrate structure 100, the array of semiconductor dies 702 and the cap, frame and contact structure 400 is encapsulated with a molding compound. The encapsulated units of the semiconductor dies 702 with the corresponding caps 402 and the corresponding sets of electrical contact elements 410 are singulated. Singulating removes the frame elements 408.

In this embodiment of the invention, encapsulating leaves the sets of electrical contact elements 410 exposed at a surface of the units. This example of the method of the invention includes mounting respective ball grid arrays on the sets of electrical contact elements 410 of the encapsulated units. In this example of the method of the invention, connecting the semiconductor dies 702 electrically with the sets of electrical contact elements 410 includes bonding wires to the electrical contact elements 410 and the dies 702, the wires passing between the corner legs 404. In this embodiment of the invention, the substrate elements 102 provide heat sinks for the semiconductor dies 702, and bonding wires to the dies 702 includes bonding wires between the dies 702 and the substrate elements 102.

In this embodiment of the invention, the caps 402 provide heat sinks for the semiconductor dies 702, the cap, frame and contact structure 400 comprising thermally conductive material, which is also electrically conductive material. The material of the cap, frame and contact structure 400 may be metallic.

This example of a surface mount semiconductor device 1500 in accordance with an embodiment of the invention has top and bottom faces 1502 and 1504 and edge surfaces 1506. The surface mount semiconductor device 1500 comprises a substrate element 102 linked to substrate corner elements 104 and presenting recesses 1508 at the edge surfaces 1506 (FIG. 15), the recesses 1508 extending between the substrate corner elements 104. The surface mount semiconductor device 1500 also comprises at least one semiconductor die 702 on the substrate element and a cap, frame and contact module 400 having a cap 402 linked by corner legs 404 to frame corner elements 406, and sets of electrical contact elements such as 410. The cap 402 extends over the semiconductor die 702, the frame corner elements 406 extend over the substrate corner elements 104, and the sets of electrical contact elements 410 are disposed in the recesses 1508 on opposite sides of the substrate element 102. The semiconductor die 702 is connected electrically with the electrical contact elements 410. The substrate element 102, the semiconductor die 702 and the cap, frame and contact module 400 are encapsulated with a molding compound.

In this embodiment of the invention, the sets of electrical contact elements 410 are disposed at a lower level than the frame corner elements 406. In this example, the sets of electrical contact elements 410 are exposed at the bottom face 1504. In this embodiment of the invention, a ball grid array is mounted on the sets of electrical contact elements 410.

In this embodiment of the invention, the device 1500 includes bonding wires connecting the semiconductor die 702 electrically with the sets of electrical contact elements 410, the wires passing between the corner legs 404. In this example, the substrate element 102 provides a heat sink for the semiconductor die 702 and is exposed at the bottom face 1504 of the device, the substrate element 102 comprising thermally conductive material, which is also electrically conductive. The device 1500 may include bonding wires connecting the semiconductor die 702 thermally to the substrate element 102.

In this example of the device 1500, the cap 402 provides a heat sink for the semiconductor die 702 and is exposed at the top face 1502 of the device. The cap, frame and contact module comprises thermally conductive material, which is also electrically conductive. The material of the cap, frame and contact module may be metallic.

It will be appreciated that the semiconductor device such as 1500 may include more than one semiconductor die 702. Also, although each set of electrical contact elements 410 is illustrated with a single row of contact elements, it will be appreciated that each set may have more than one row of electrical contact elements, the rows being offset from each other.

Figure 1:
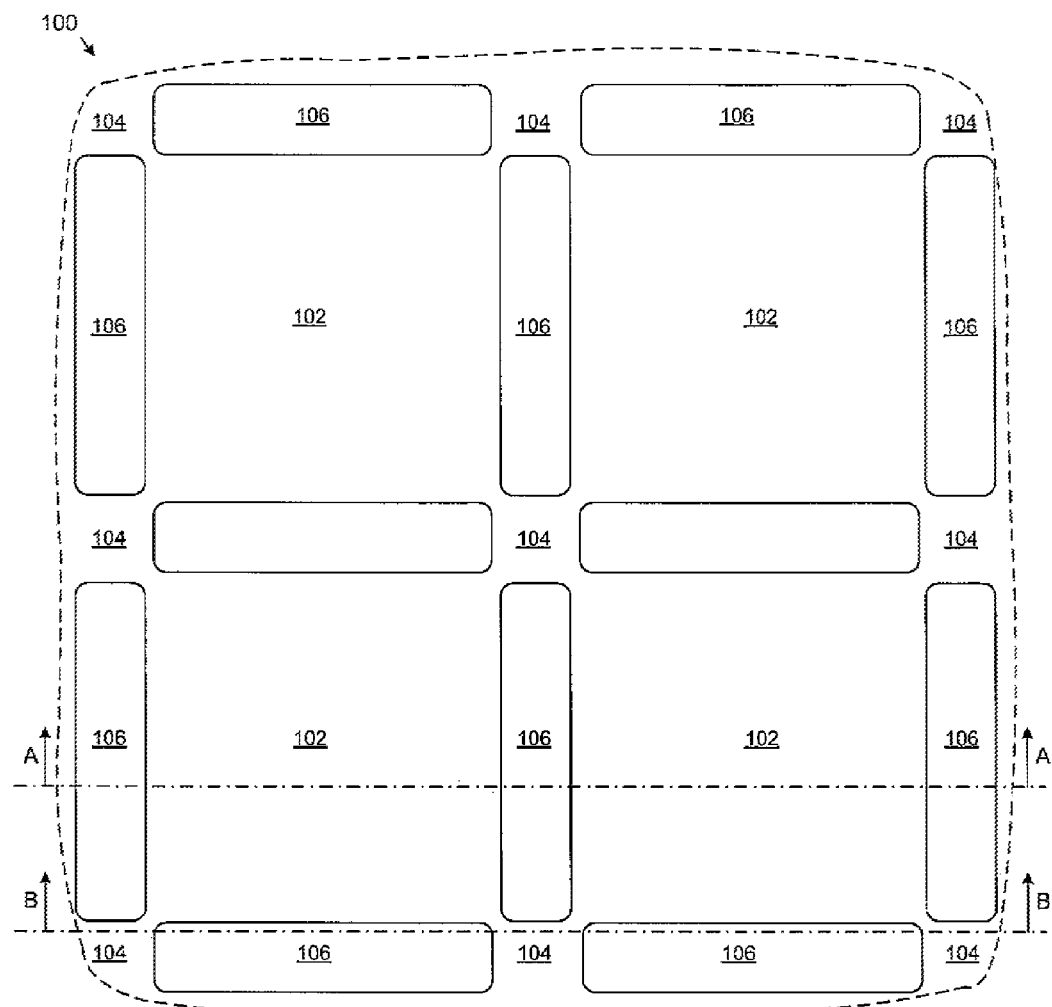
FIG. 1 is a schematic plan view of part of a substrate structure used in a method of making a semiconductor device in accordance with one embodiment of the invention, given by way of example.
Figure 2:
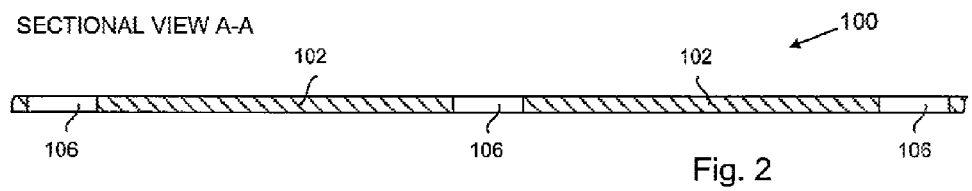
FIGS. 2 and 3 are schematic sectional views of the substrate structure of FIG. 1 along the lines A-A and B-B of FIG. 1.
Figure 3:
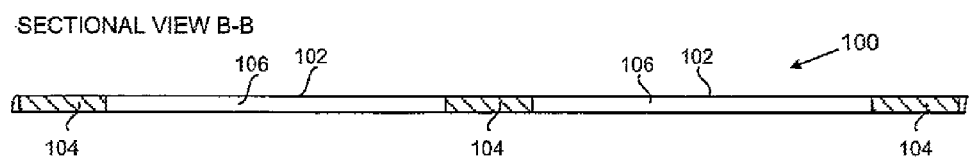

In more detail, as shown in FIGS. 1 to 3, the substrate structure 100 is provided, for example by blanking, etching or molding a sheet of material. In this example, the substrate structure 100 is flat and planar but in another example the substrate structure 100 may be stamped, pressed or embossed to a relief shape. The substrate structure 100 has an array of rectangular substrate elements 102; in this example the substrate elements 102 are square but they may be oblong. The substrate elements 102 are linked by rectangular substrate corner elements 104, which in this example are square but may be oblong. The substrate elements 102 are separated by elongate slots 106 extending along the four sides of the substrate elements 102 between the substrate corner elements 104. The substrate structure 100 can be manipulated as a unit, since the substrate elements 102 are linked by the substrate corner elements 104, avoiding any necessity to pick and handle individually the substrate elements 102.

Figure 4:
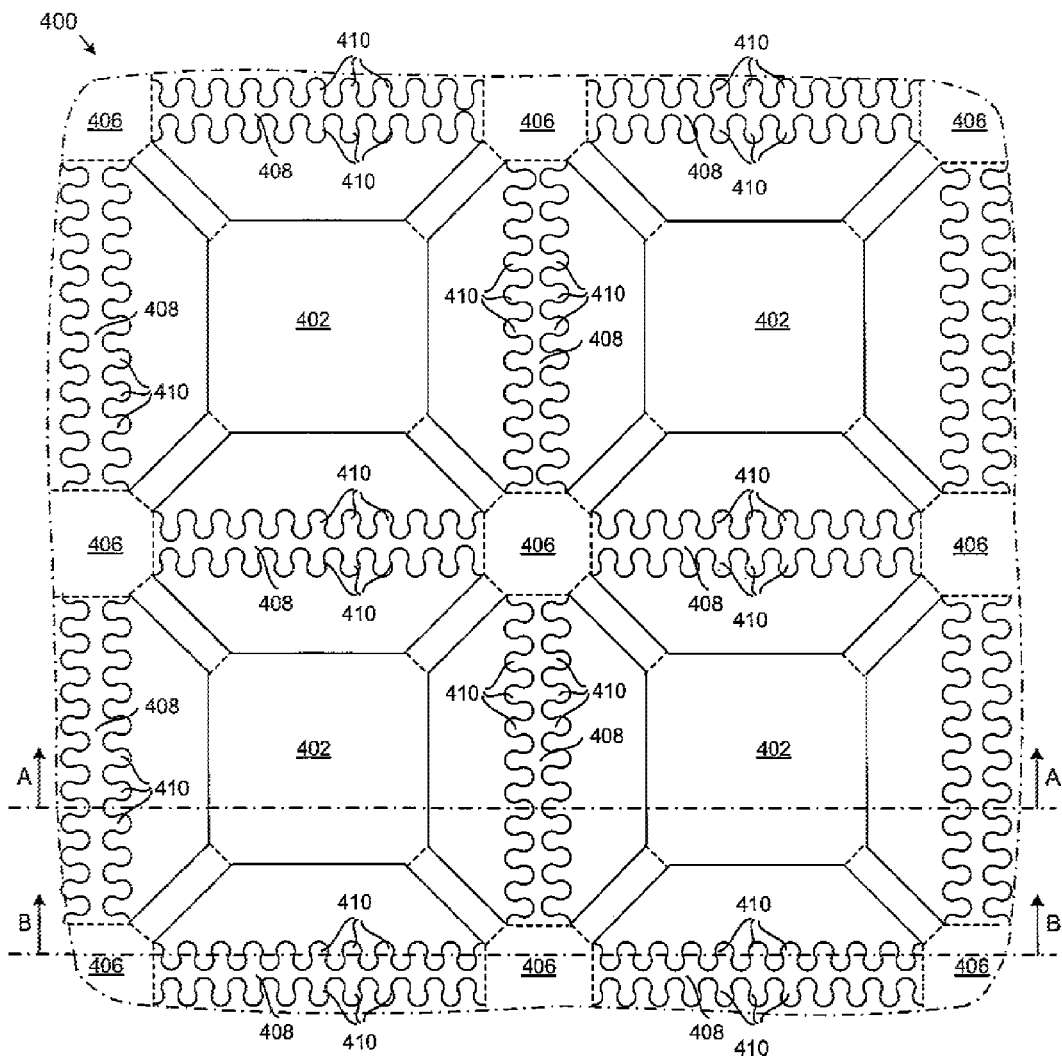
FIG. 4 is a schematic plan view of part of a cap, frame and contact structure used in a method of making a semiconductor device in accordance with this embodiment of the invention.
Figure 5:
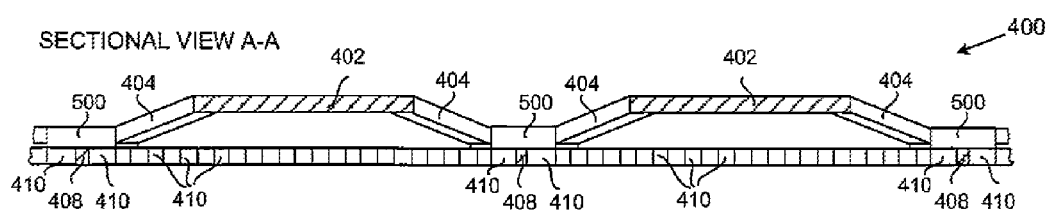
FIGS. 5 and 6 are schematic sectional views of the cap, frame and contact structure of FIG. 4 along the lines A-A and B-B of FIG. 4, which coincide with the positions of the lines A-A and B-B of FIG. 1.
Figure 6:
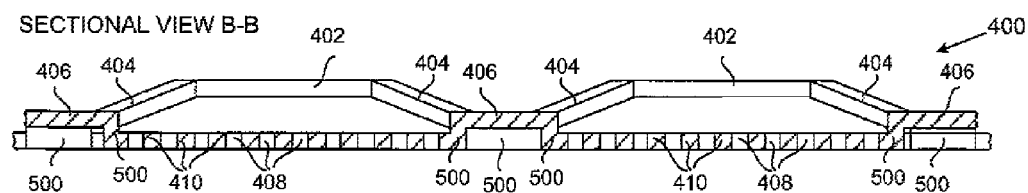

As shown in FIGS. 4 to 6, the cap, frame and contact structure 400 is provided, for example by blanking, etching and stamping, pressing or embossing a sheet of material. In this example the material is metal, such as copper, which has good electrically and thermally conductive properties.

The cap, frame and contact structure 400 has an array of caps 402 corresponding to the array of substrate elements 102, so that the caps 402 may be aligned with the substrate elements 102. In this example, the caps 402 are of similar shape to the substrate elements 102, although they may be of different shape, and are slightly smaller than the substrate elements 102, although they may be a similar size. In this example, the caps 402 are square but they may be oblong.

The caps 402 are supported by corner legs 404 linking the caps 402 to frame corner elements 406. The corner legs 404 extend diagonally of the caps 402. In this example, the frame corner elements 406 are positioned at a lower level than the caps 402 and the corner legs 404 are inclined, although the frame corner elements 406 may be positioned at the same level as the caps 402. The plurality of frame elements 408 linking the frame corner elements 406 extend along the four sides of the caps 402 between the frame corner elements 406. The sets of electrical contact elements such as 410 supported by the frame elements 408 are positioned at the lowest level of the cap, frame and contact structure 400. In particular, the sets of electrical contact elements 410 are positioned at a lower level than the frame corner elements 406 and are exposed at the bottom face and edge surfaces of the finished device 1500. In this example, the sets of electrical contact elements 410 are integral with the corresponding frame elements 408 and the sets of electrical contact elements 410 of adjacent units of the array project in opposite directions from a common frame element 408. In this example, the frame elements 408 are at the same lowest level as the sets of electrical contact elements 410 and the frame corner elements 406 and the frame elements 408 are linked by vertical supports 500, seen in FIGS. 5 and 6. However in another embodiment of the invention the frame elements 408 are at a higher level than the sets of electrical contact elements 410.

The cap, frame and contact structure 400 can also be manipulated as a unit, since the caps 402, the frame elements 408 and the sets of electrical contact elements 410 supported by the frame elements 408 are linked by the frame corner elements 406, avoiding any necessity to pick and handle the elements individually.

Figure 8:
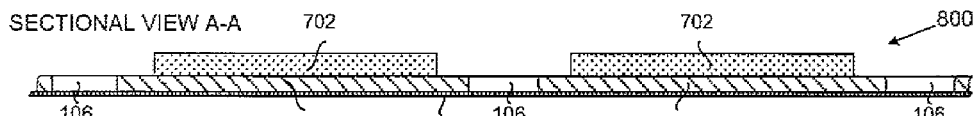
FIGS. 8 and 9, 10 and 11, and 12 and 13 are schematic sectional views of the device structure of FIG. 4 along the lines A-A and B-B respectively at successive stages of a method of making a semiconductor device in accordance with this embodiment of the invention.
Figure 9:
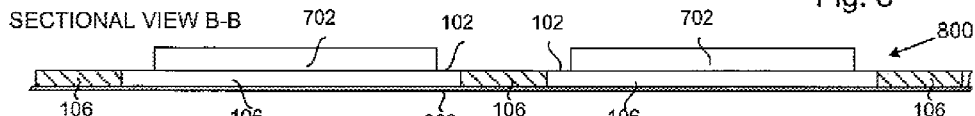

FIGS. 8 to 14 illustrate successive steps in this method of making the semiconductor device 1500. As shown in FIGS. 8 and 9, the semiconductor dies 702 are picked and mounted in array on the top surface of the substrate structure 100 with the edges of the semiconductor dies 702 parallel to the slots 106 and the back faces of the semiconductor dies 702 are bonded to the respective substrate elements 102. An assembly 800 is then formed by mounting the bottom surface of the substrate structure 100 on an adhesive sheet 802.

Figure 7:
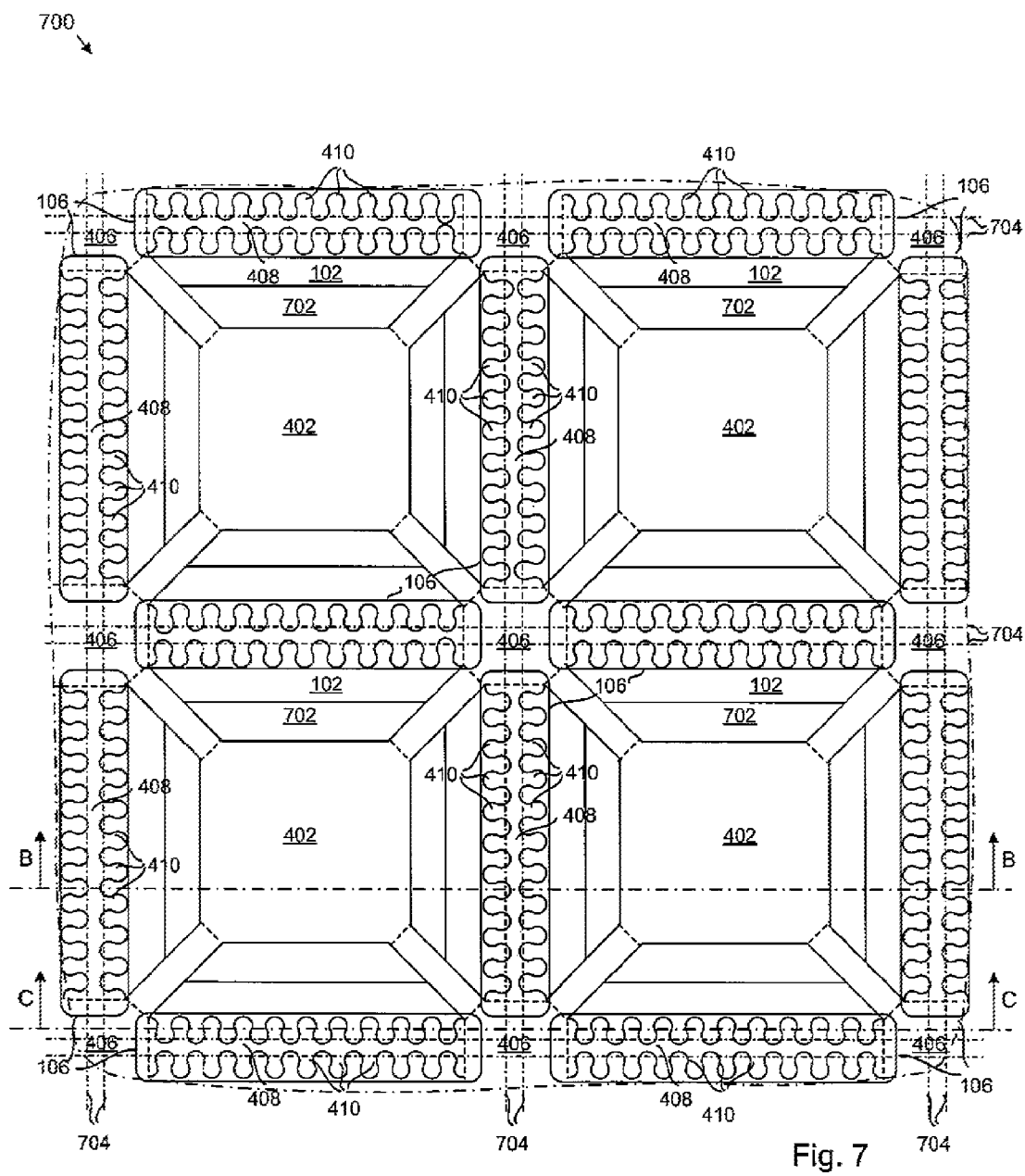
FIG. 7 is a schematic plan view of part of an assembly of the substrate structure of FIGS. 1 to 3 and the cap, frame and contact structure of FIGS. 4 to 6 used in a method of making a semiconductor device in accordance with this embodiment of the invention.
Figure 10:
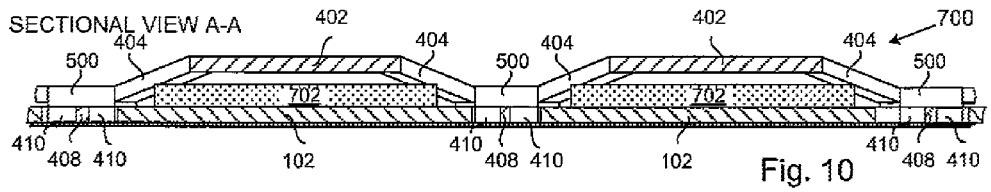
Figure 11:
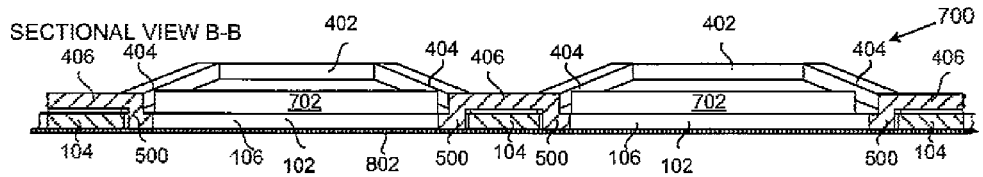

As shown in FIG. 7 (in top view) and FIGS. 10 and 11 (in sectional view), the cap, frame and contact structure 400 is then fitted on the assembly 800, with the sets of electrical contact elements 410 and the frame elements 408 positioned within the slots 106. The caps 402 are aligned above the dies 702 and the substrate elements 102, and the frame corner elements 406 are aligned above the substrate corner elements 104. The level of the frame corner elements 406 is chosen to be high enough for them to pass over the substrate corner elements 104. The level of the caps 402 is chosen to be high enough for them to pass over the dies 702.

Figure 12:
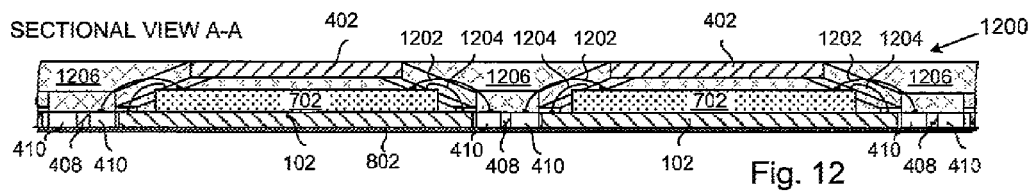
Figure 13:
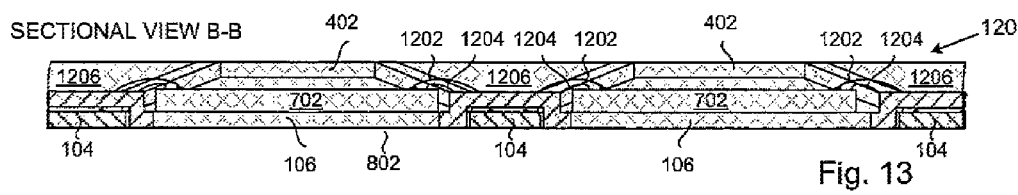

As shown in FIGS. 12 and 13, an encapsulated assembly 1200 is then formed. The semiconductor dies 702 are first connected electrically with the electrical contact elements 410. In this embodiment of the invention, the electrical connections are made by bonding wires 1202 to the electrical contact elements 410 and to electrical contact pads (not shown) on the active faces of the dies 702. In this embodiment of the invention, the substrate elements 102 provide heat sinks for the semiconductor dies 702, and bonding wires to the dies 702 includes also bonding wires 1204 between the dies 702 and the substrate elements 102 to increase thermal conduction between the dies 702 and the substrate elements 102. The wires 1202 and 1204 pass between the corner legs 404, and the height and size of the caps 402 is chosen to facilitate bonding the wires 1202 and 1204 to the active faces of the dies 702. The encapsulation of the assembly is then performed by placing a mold (not shown) over the assembly on the adhesive sheet 802, and introducing molding compound 1206 in a liquid or semi-liquid state into the mold. The molding compound 1206 penetrates between the different components of the assembly and adheres to them, so that after curing the molding compound 1206 supports and unifies the different components. Conventional materials may be used for the molding compound 1206. The molding compound 1206 is typically an electrical insulator, isolating the electrical contact elements 410 after singulation. The adhesive sheet 802 prevents the molding compound 1206 from covering the bottom surfaces of the electrical contact elements 410, leaving them exposed for electrical connection in the finished device 1500. The molding compound 1206 is typically also a poor thermal conductor, so that the thickness of the molding compound 1206 interposed between the active face of the dies 702 and the caps 402 is reduced by reducing the heights of the caps 402 over the active faces of the dies 702, while preserving sufficient clearance to provide electrical insulation for the contact pads on the active faces of the dies 702 and for the bonding wires 1202 and 1204. In the drawings, for the sake of illustration the molding compound 1206 is shown as if it is transparent, leaving visible the components behind it, although commonly the molding compound is opaque.

The adhesive sheet 802 is removed after curing the molding compound 1206. In this embodiment of the invention, as shown in FIG. 14, solder balls such as 1400 are attached to the exposed bottom surfaces of the electrical contact elements 410, forming a BGA. Other conventional processes may be used to produce other configurations of external contacts for the finished device 1500, such as LGA, or building up on the electrical contact elements 410 pillars with solder capping, for example. It is also possible to form a redistributed chip package ('RCP') layer on the bottom surface.

The individual encapsulated units 1500 are then singulated by suitable methods along singulation streets 704, illustrated by chain dotted lines in FIGS. 7 and 14. The singulation streets 704 are positioned with a suitable width so that singulating removes the frame elements 408, while leaving the electrical contact elements 410 supported by the molding compound 1206. The substrate corner elements 104 (and the frame corner elements 406) are also cut along the singulation streets, so that the slots 106 are left forming the recesses 1508 extending between the residual parts of the substrate corner elements 104. In the case of a quad flat 'no lead' ('QFN') package the electrical contact elements 410 may be left exposed at the edge surfaces 1506 of the device 1500 as well as the bottom face 1504.

Figure 16:
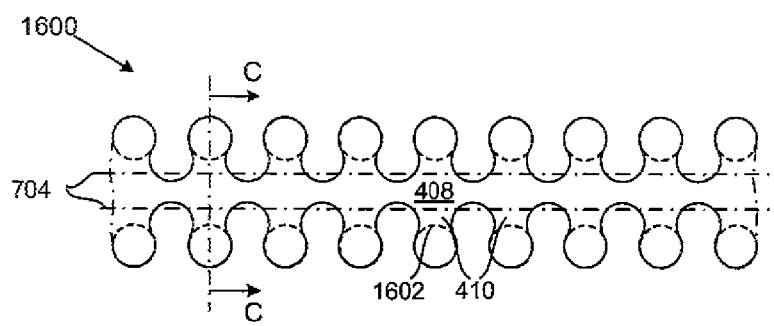
FIG. 16 is a schematic plan view of part of a cap, frame and contact structure used in a method of making a semiconductor device in accordance with another embodiment of the invention.
Figure 17:
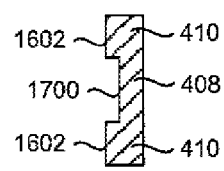
FIGS. 17 to 19 are schematic sectional views corresponding to FIG. 16 along the line C-C at successive stages of that method of making a semiconductor device.
Figure 18:
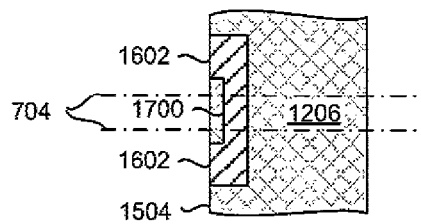
Figure 19:
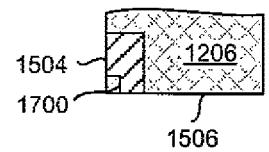

In the example illustrated in FIGS. 1 to 15, the bottom surfaces of the frame elements 408 and of the sets of electrical contact elements 410 are positioned in the same plane. In another example of an embodiment of the invention illustrated in FIGS. 16 to 19, the bottom surfaces of the frame elements 408 and of the sets of electrical contact elements 410 are at two levels. FIGS. 16 and 17 are a scrap plan and sectional views of a part of the frame elements 408 and of the sets of electrical contact elements 410 in a cap, frame and contact structure 1600 otherwise similar to the cap, frame and contact structure 400. In producing the cap, frame and contact structure 1600, the bottom surface of the frame elements 408 and of the sets of electrical contact elements 410 is initially planar. The bottom surface is then etched selectively part way through the thickness of the material of the frame elements 408 and of the sets of electrical contact elements 410. Areas of the bottom surface are protected during the etching operation, by photo resist for example, so as to leave pads 1602 on each of the electrical contact elements 410 projecting from the etched surface 1700. The etching may be performed after the mechanical shaping operations, but in this example is performed before pressing or embossing, on the flat blank material. During encapsulation, as shown in FIG. 18, the molding compound 1206 penetrates between the pads 1602 and under the etched surface 1700, so that it covers the bottom surface 1504 of the device except for leaving the pads 1602 exposed. The configuration of FIGS. 16 to 19 may be used in a BGA implementation of the kind otherwise as shown in FIGS. 14 and 15, for example, in which case the molding compound around the pads 1602 limits spread of solder connections to the pads, reducing the probability of short-circuits between solder balls on adjacent pads. During singulation of the devices, the molding compound around the pads 1602 increases the area of adhesion between the frame elements 408 and the molding compound 1206, reducing the risk of delamination in the edge surfaces 1506 of the device. Moreover, the reduction of thickness of the frame elements 408 in the saw streets 704 facilitates saw singulation, reducing assembly cost.

It will be appreciated that the method of making a surface mount semiconductor devices 1500 illustrated in the drawings and described above enables caps 402 to be provided in the devices without extra process steps. The electrical contact elements 410 may be formed in a unitary structure 400 with the caps 402 and the frame elements 408 which can be manipulated as a whole and assembled with the substrate structure 100. The resulting assembly may then be processed using techniques adapted to fabrication facilities.

In the foregoing specification, the invention has been described with reference to specific examples of embodiments of the invention. It will, however, be evident that various modifications and changes may be made therein without departing from the broader spirit and scope of the invention as set forth in the appended claims.

For example, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated devices may be implemented as circuitry located on a single integrated circuit or within a same die. Alternatively, the devices may be implemented as a plurality of integrated circuits or dies interconnected with each other in a suitable manner.

In the claims, the words 'comprising' and 'having' do not exclude the presence of other elements or steps then those listed in a claim. The terms "a" or "an," as used herein, are defined as one or more than one, where the context admits. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The fact that certain measures are recited in mutually different claims does not indicate that a combination of these measures cannot be used to advantage.

The invention claimed is:

1. A surface mount semiconductor device having top and bottom faces and edge surfaces, comprising:
   a substrate element linked to substrate corner elements and presenting recesses at said edge surfaces, said recesses extending between said substrate corner elements;
   at least one semiconductor die on said substrate element;
   a cap, frame and contact module wherein said cap is linked by corner legs to frame corner elements, and sets of electrical contact elements;
   said cap extending over said semiconductor die, said frame corner elements extending over said substrate corner elements, and said sets of electrical contact elements being disposed in said recesses on opposite sides of said substrate element;
   said semiconductor die being connected electrically with said electrical contact elements; and
   said substrate element, said semiconductor die and said cap, frame and contact module being encapsulated with a molding compound.

2. The semiconductor device of claim 1, wherein said sets of electrical contact elements are disposed at a lower level than said frame corner elements.

3. The semiconductor device of claim 1, wherein said sets of electrical contact elements are exposed at said bottom face.

4. The semiconductor device of claim 3, wherein a ball grid array is mounted on said sets of electrical contact elements.

5. The semiconductor device of claim 1, wherein the device includes first bonding wires connecting said semiconductor die electrically with said sets of electrical contact elements, said first bonding wires passing between said corner legs.

6. The semiconductor device of claim 5, wherein the device includes second bonding wires connecting said semiconductor die thermally to said substrate element.

7. The semiconductor device of claim 1, wherein said substrate element provides a heat sink for said semiconductor die and is exposed at said bottom face of the device, said heat sink comprising thermally conductive material.

8. The semiconductor device of claim 1, wherein said cap provides a heat sink for said semiconductor die and is exposed at said top face of the device, said cap, frame and contact module comprising thermally conductive material.

9. The semiconductor device of claim 1, wherein said cap, frame and contact module comprise electrically conductive material.

10. The semiconductor device of claim 1, wherein said cap, frame and contact module comprises metallic material.

* * * * *